(12) United States Patent  (10) Patent No.: US 9,190,096 B2
Sasaki et al.  (45) Date of Patent: Nov. 17, 2015

(54) METHOD FOR PRODUCING GLASS SUBSTRATE AND METHOD FOR PRODUCING MAGNETIC RECORDING MEDIUM

(75) Inventors: Kenichi Sasaki, Osaka (JP); Hideki Kawai, Kobe (JP)

(73) Assignee: HOYA CORPORATION, Tokyo (JP)

( * ) Notice: Subject to any disclaimer, the term of this patent is extended or adjusted under 35 U.S.C. 154(b) by 388 days.

(21) Appl. No.: 13/124,029

(22) PCT Filed: Sep. 11, 2009

(86) PCT No.: PCT/JP2009/065916
§ 371 (c)(1),
(2), (4) Date: Apr. 13, 2011

(87) PCT Pub. No.: WO2010/044325
PCT Pub. Date: Apr. 22, 2010

(65) Prior Publication Data
US 2011/0195638 A1  Aug. 11, 2011

(30) Foreign Application Priority Data

Oct. 17, 2008 (JP) .................. 2008-268410

(51) Int. Cl.
*G11B 5/84* (2006.01)
*H01L 21/67* (2006.01)

(52) U.S. Cl.
CPC ........ *G11B 5/8404* (2013.01); *H01L 21/67028* (2013.01)

(58) Field of Classification Search
CPC .............. C03C 17/25; C03C 2217/214; C03C 2217/29; G11B 5/8404; G11B 5/713
USPC ............. 428/64.2, 64.3, 66.6, 410, 404, 692, 428/693, 846.9, 848.8, 846.3; 65/61, 65, 65/284, 30.14, 33.9, 120, 92, 29.14, 112; 451/41, 364, 36, 60, 7; 501/128, 64, 501/62, 68, 69
See application file for complete search history.

(56) References Cited

U.S. PATENT DOCUMENTS 6,258,137 B1 * 7/2001 Garg et al. ................ 501/128
6,428,396 B2 * 8/2002 Isono et al. ................. 451/41
6,494,985 B1 * 12/2002 Sotozaki et al. ......... 156/345.12
2002/0108400 A1 * 8/2002 Watanabe et al. ........... 428/64.2
2002/0121110 A1 * 9/2002 Saito et al. .................. 65/30.14

(Continued)

FOREIGN PATENT DOCUMENTS

EP  798766 A1 * 10/1997
JP  05-089459  4/1993

(Continued)

OTHER PUBLICATIONS

International Search Report in International Application No. PCT/JP2009/065916, mailed Nov. 2, 2009, 2 pages.

*Primary Examiner* — Kevin M. Bernatz
(74) *Attorney, Agent, or Firm* — Brinks Gilson & Lione

(57) ABSTRACT

Disclosed is a method for producing a glass substrate, which involves a first polishing step and a second polishing step both for polishing the surface of the glass substrate with a polishing solution containing a polishing agent. The method is characterized by additionally involving a heating step for heating the glass substrate, wherein the heating step is carried out after the first polishing step and before the second polishing step.

11 Claims, 3 Drawing Sheets

(56) References Cited

U.S. PATENT DOCUMENTS

| | | | |
|---|---|---|---|
| 2002/0197437 A1* | 12/2002 | Hashimoto et al. | 428/64.3 |
| 2003/0096078 A1* | 5/2003 | Horisaka et al. | 428/66.6 |
| 2003/0110803 A1* | 6/2003 | Saito et al. | 65/30.14 |
| 2003/0228461 A1* | 12/2003 | Yoshikawa et al. | 428/325 |
| 2004/0087248 A1* | 5/2004 | Hirokawa | 451/7 |
| 2004/0137828 A1* | 7/2004 | Takahashi et al. | 428/410 |
| 2004/0194508 A1* | 10/2004 | Nishimoto et al. | 65/61 |
| 2005/0096210 A1* | 5/2005 | Kawai | 360/135 |
| 2005/0204777 A1* | 9/2005 | Mori et al. | 65/112 |
| 2006/0216552 A1* | 9/2006 | Ikenishi et al. | 428/846.9 |
| 2007/0196699 A1* | 8/2007 | Aida | 428/846.1 |
| 2007/0251270 A1* | 11/2007 | Miyatani et al. | 428/846.9 |
| 2007/0266734 A1* | 11/2007 | Woelfing et al. | 65/284 |
| 2007/0271957 A1* | 11/2007 | Nakamura et al. | 65/29.14 |
| 2008/0014468 A1* | 1/2008 | Kawai et al. | 428/846.9 |
| 2008/0020679 A1* | 1/2008 | Usui et al. | 428/846.9 |
| 2008/0085658 A1* | 4/2008 | Katsuoka et al. | 451/7 |
| 2008/0220700 A1* | 9/2008 | Minami et al. | 451/364 |
| 2008/0241603 A1* | 10/2008 | Isono | 428/846.9 |
| 2008/0311487 A1* | 12/2008 | Ito et al. | 430/5 |
| 2009/0004764 A1* | 1/2009 | Ohnuma et al. | 438/30 |
| 2009/0239102 A1* | 9/2009 | Nagashima et al. | 428/846.9 |
| 2010/0062287 A1* | 3/2010 | Beresford et al. | 451/36 |
| 2010/0162761 A1* | 7/2010 | Carney et al. | 65/284 |
| 2011/0104427 A1* | 5/2011 | Suzuki | 428/64.2 |
| 2011/0143636 A1* | 6/2011 | Miyahara et al. | 451/2 |

FOREIGN PATENT DOCUMENTS

| | | |
|---|---|---|
| JP | 11-154325 | 6/1999 |
| JP | 3184261 | 7/2001 |
| JP | 3184495 | 7/2001 |
| JP | 2002-092867 A | 3/2002 |
| JP | 2006-099813 | 4/2006 |
| JP | 2007-115388 | 5/2007 |
| JP | 2007-305217 | 11/2007 |
| WO | WO 2008/004472 A1 | 1/2008 |

* cited by examiner

METHOD FOR PRODUCING GLASS SUBSTRATE AND METHOD FOR PRODUCING MAGNETIC RECORDING MEDIUM This application is a National Stage of International Application PCT/JP2009/065916 filed with Japanese Patent Office on Sep. 11, 2009.

TECHNICAL FIELD

The present invention relates to a method for producing a glass substrate and a method for producing a magnetic recording medium.

BACKGROUND ART

Conventionally, as information recording media used for computers, magnetic disks are available. As magnetic disk substrates, aluminum substrates have been commonly used. However, over recent years, with the demand for reduction of magnetic head floating amount for enhancing recording density, glass substrates are used at an increasing percentage, with which glass substrate the magnetic floating amount is reduced because glass substrates exhibit superior surface flatness and have fewer surface defects than aluminum substrates.

These glass substrates of magnetic disks are produced by polishing glass substrates referred to as blank materials. It is known that such glass substrates (blank materials) are produced by a production method employing press molding and a production method in which plate glass produced by a float method is cut. Glass substrates cut out in a certain shape have large surface non-uniformity as such. Therefore, the surface needs to be polished. Further, to meet the demand for higher density, the technology of high precision polishing is required.

As well known conventionally, the process of surface finishing of glass roughly contains the following steps: a first lapping step; a second lapping step; a first polishing step; and a second polishing step (for example, refer to Patent Document 1 and Patent Document 2).

The first lapping step is a step in which both surfaces of a glass substrate is polished to preliminarily adjust the parallelism, the flatness, and the thickness of the glass substrate. The second lapping step is a step to fine-tune the parallelism, the flatness, and the thickness of a glass substrate.

The first polishing step and the second polishing step are so-called polishing steps. In the first polishing step, scratches and defects are eliminated and the surface of a glass substrate is allowed to have predetermined surface roughness. Thereafter, in the second polishing step, the surface of the glass substrate is polished further precisely. Recently, since a glass substrate is required to have high-level flatness, in both the first polishing step and the second polishing step, a polishing method employing a polishing liquid containing polishing agent is used.

RELATED ART DOCUMENT

Patent Document

Patent Document 1: Japanese Registered Patent Publication No. 3184261
Patent Document 2: Japanese Registered Patent Publication No. 3184495

DISCLOSURE OF THE INVENTION

Object of the Invention

However, in the conventional polishing steps as described in Patent Document 1 and Patent Document 2, it has become extremely difficult to efficiently produce a glass substrate having higher-level flatness.

In view of the above problem, the present invention was conceived, and an object thereof is to provide a method for producing a glass substrate in which a glass substrate having enhanced flatness can be efficiently produced and a method for producing a magnetic recording medium in which a magnetic recording medium having enhanced flatness can be efficiently produced.

Means for Solving the Object

In order to solve the afore-mentioned objects, the present invention has the following features.

Item 1. A method for producing a glass substrate having a first polishing step and a second polishing step of polishing a surface of the glass substrate with polishing liquid containing polishing agent, the method comprising:
a heating step of heating the substrate,
wherein the heating step is performed after the first polishing step is performed and before the second polishing step is performed.

Item 2. The method for producing a glass substrate of item 1, wherein the heating step is a step of heating at 100° C. to 300° C.

Item 3. The method for producing a glass substrate of item 1 or 2, wherein the second polishing step is performed just after the heating step.

Item 4. The method for producing a glass substrate of any one of items 1 to 3, the method comprising, between the first polishing step and the heating step:
a cleaning step of cleaning the glass substrate; and
a drying step of drying the glass substrate.

Item 5. The method for producing a glass substrate of item 4, wherein in the drying step, gas is blown against the glass substrate.

Item 6. A method for producing a magnetic recording medium, the method comprising the step of:
forming a magnetic film on a glass substrate produced by the method for producing a glass substrate of any one of items 1 to 5.

Advantage of the Invention

According to the present invention, after a first polishing step has been carried out, a heating step is carried out prior to a second polishing step, thereby the glass substrate surface is activated by heating and then chemical reactivity is substantially enhanced as compared with immediately after the first polishing step. Thus, in the second polishing step, since the reactivity is thus enhanced, a polishing liquid is uniformly spread over the entire surface of the glass substrate, whereby polishing for a short period of time realizes high flatness.

Therefore, there is provided a method for producing a glass substrate in which a glass substrate having high flatness is efficiently produced and a method for manufacturing a magnetic recording medium in which a magnetic recording medium having high flatness is efficiently manufactured.

BEST MODE FOR CARRYING OUT THE INVENTION

The present invention will now be described with reference to an embodiment shown without the present invention being limited thereto.

Figure 1:
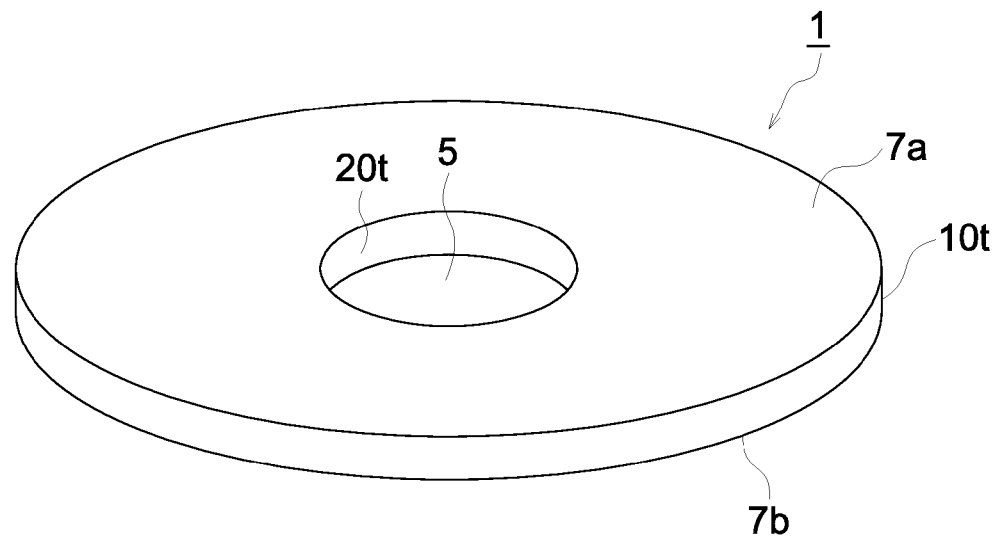
FIG. 1 is a diagram showing the entire constitution of a glass substrate.

FIG. 1 shows the entire constitution of a glass substrate 1 according to the present invention. As shown in FIG. 1, the glass substrate 1 has a doughnut-like circular disk shape in which a hole 5 is formed at the center. Symbol 10t represents the outer circumferential edge face, 20t represents the inner circumferential edge face, 7a represents the front main surface, and 7b represents the rear main surface.

Figure 2:
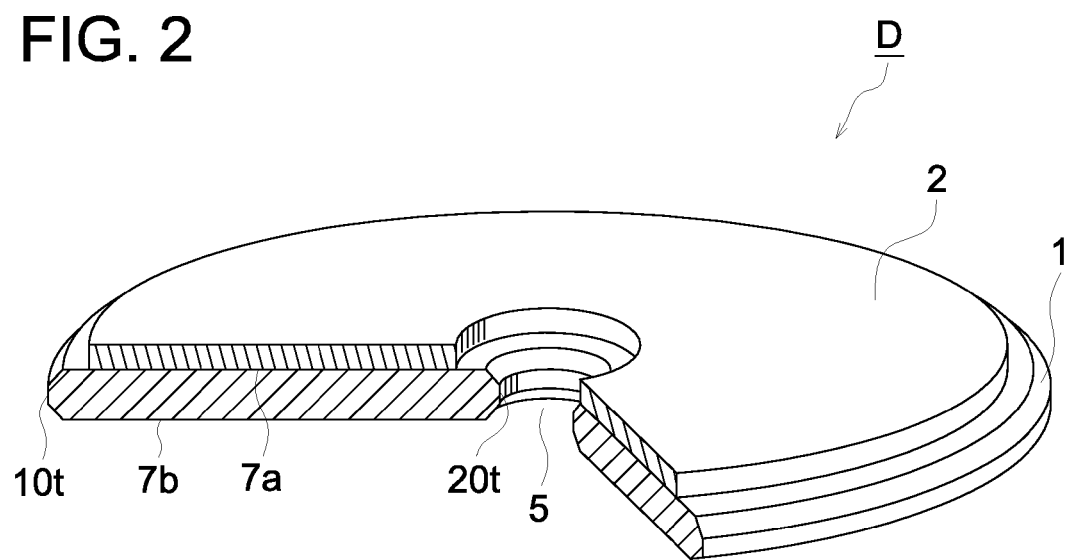
FIG. 2 is a diagram showing an example of a magnetic recording medium having a magnetic film on the front main surface of a glass substrate.

FIG. 2 is a perspective view of a magnetic disk of an example of a magnetic recording medium according to the present invention. In this magnetic disk D, a magnetic film 2 is directly formed on the surface of a circular glass substrate 1. Herein, the magnetic film 2 can also be provided on the rear main surface 7b.

Figure 3:
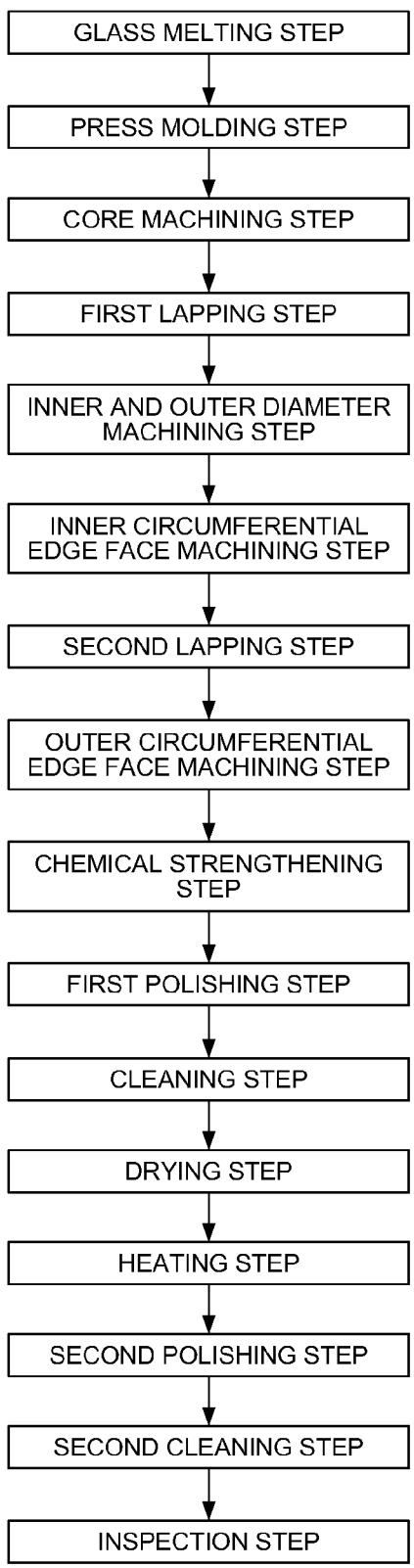
FIG. 3 is a production process diagram showing steps in production of a glass substrate.

FIG. 3 is a production process diagram of one example of the method for manufacturing a glass substrate according to the present invention.

The production process of the present embodiment has a feature in which after a first polishing step has been carried out, a heating step is carried out prior to a second polishing step. With reference to FIG. 3, the production process of the glass substrate of the present embodiment will now be detailed.

It should be noted that the glass substrate of the present invention is not limited for magnetic recording media but may be used for optical magnetic disks and optical disks.

<Production Process of Glass Substrate>

The size of a glass substrate is not specifically limited. Variously-sized glass substrates having outer diameters of 2.5 inches, 1.8 inches, 1 inch, and 0.8 inches are available. Further, the thickness of such a substrate is not limited either. Glass substrates having various thicknesses of 2 mm, 1 mm, and 0.63 mm are available.

(Glass Melting Step)

Initially, a glass material is melted.

The material of a glass substrate is not specifically limited. Glass able to be chemically strengthened is preferably used. Usable are soda-lime glass containing $SiO_2$, $Na_2O$, and CaO as main components, aluminosilicate glass containing $SiO_2$, $Al_2O_3$, and $R_2O$ (R=K, Na, and Li) as main components, borosilicate glass, $Li_2O$—$SiO_2$-based glass, $Li_2O$—$Al_2O_3$—$SiO_2$-based glass, and R'O—$Al_2O_3$—$SiO_2$-based glass (R'=Mg, Ca, Sr, and Ba). Of these glasses, aluminosilicate glass and borosilicate glass are specifically preferable because of excellent impact resistance and vibration resistance.

(Press Molding Step)

Molten glass supplied into a lower die is press-molded using an upper die, and a circular disk-shaped glass substrate precursor is obtained. Herein, a circular disk-shaped glass substrate precursor may also be produced in such a mariner that sheet glass formed by, for example, a down-draw method or a float method may cut out by a grinding stone, instead of using press molding method.

(Coring Step)

In a press-molded glass substrate precursor, a hole is opened in the center thereof using a core drill provided with a diamond grinding stone in the cutter section.

(First Lapping Step)

Subsequently, both surfaces of the glass substrate are subjected to lapping, and whereby the entire shape of the glass substrate, that is, the parallelism, the flatness, and the thickness of the glass substrate is preliminarily adjusted.

(Inner and Outer Diameter Machining Step)

Next, the outer circumferential edge face and the inner circumferential edge face of the glass substrate are subjected to inner-and-outer diameter machining and is grinded, for example, using a drum-shaped grinding stone such as diamond. Through this inner-and-outer diameter machining, the outer diameter dimension and the circularity of the glass substrate, the inner diameter dimension of the hole, and the concentricity between the glass substrate and the hole are fine-tuned, and also the inner and outer circumferential corners of the glass substrate are subjected to chamfering of 45° with a width of about 1 mm-2 mm.

(Inner Circumferential Edge Face Machining Step)

Thereafter, in the inner circumferential edge face of the glass substrate, the corner of the chamfered portion is made to have a curved face by brush polishing with polishing liquid, and minute scratches are accordingly eliminated.

(Second Lapping Step)

Next, both surfaces of the glass substrate are again subjected to lapping to fine-tune the parallelism, the flatness, and the thickness of the glass substrate.

(Outer Circumferential Edge Face Machining Step)

Then, in the outer circumferential edge face of the glass substrate, the corner of the chamfered portion is made to have a curved face by brush polishing employing with polishing liquid, and minute scratches are accordingly eliminated.

The order from the first lapping step to the outer circumferential edge face machining step after coring step is not limited to one shown in FIG. 3 and can be appropriately changed depending on the situation. For example, it is possible that only one lapping step is employed and initially carried out, and then an inner-and-outer diameter machining step and an inner circumferential and an outer circumferential edge face machining step are carried out. Further, it is possible that a first lapping step and an inner outer diameter machining step are carried out, followed by a second lapping step and an inner circumferential and an outer circumferential edge face machining step.

A polisher carrying out lapping of a glass substrate in the first and the second lapping step will now be described. As the polisher, a well-known polisher referred to as a dual sided polisher is usable. The dual sided polisher is provided with circular disk-shaped upper and lower platens arranged above and below so as to be parallel to each other, and these platens are rotated in the reverse directions with respect to each other. A plurality of diamond pellets are bonded to each opposite face of these upper and lower platens to lap the main surface of a glass substrate. Between the upper and lower platens, there are a plurality of carriers which rotate being engaged with an internal gear annularly placed outside the outer circumference of the lower platen and a sun gear placed around the rotating shaft of the lower platen. Each carrier is provided with a plurality of holes and is arranged in place with glass substrates placed in these holes. The upper and lower platens, the internal gear, and the sun gear can be operated with separate drives.

In the lapping operation of the polisher, the upper and lower platens are rotated in opposite directions, and the carriers holding a plurality of glass substrates and being sandwiched by the platens via the diamond pellets revolve around the rotational center of the platens in the same direction as the lower platen while rotating. In the polisher operating in such a manner, grinding liquid is fed between the upper platen and the glass substrates as well as between the lower platen and the glass substrates, thereby lapping the glass substrates.

When this dual sided polisher is used, the machining pressure of the platens, which is applied to a glass substrate, and the rotation speed thereof are appropriately adjusted based on a desired lapped state. The machining pressure in the first and the second lapping step is preferably from 5884 Pa to 11768 Pa. Further, the rotation speed of the platens is preferably 10 rpm to 30 rpm, and the rotation speed of the upper platen is preferably smaller than that of the lower plate by about 30% to 40%. When the machining pressure of the platens is increased and the rotation speed thereof is increased, lapped amount is increased. However, if the machining pressure is excessively increased, obtained surface roughness is not good. Further, if the number of rotations is excessively large, obtained flatness is not good. Still further, if the machining pressure is small and the rotation speed of the platen is small, lapped amount is decreased and production efficiency is hence decreased.

At the time of termination of the second lapping step, defects such as large undulations, chips, and cracks are effectively eliminated. With regard to the surface roughness of the main surface of a glass substrate, it is preferable that Rz (maximum height roughness) is 2 μm to 4 μm and Ra (arithmetic average roughness) is about 0.2 μm to 0.4 μm. Since such a surface state is obtained, after the following chemical strengthening step, polishing can be efficiently carried out in the polishing step.

In the first lapping step, to efficiently carry out the second lapping step, large undulations, chips, and cracks are roughly eliminated efficiently. Therefore, compared with diamond pellets with a roughness of about #1300 mesh to #1700 mesh used in the second lapping, rough diamond pellets with a roughness of about #800 mesh to #1200 mesh are preferably used. With regard to the surface roughness at the time of completion of the first lapping step, it is preferable that Rz is 4 μm to 8 μm and Ra is about 0.4 μm to 0.8 μm.

The inner circumferential and the outer circumferential edge face of a glass substrate are polished by brush polishing in the inner and outer circumferential edge face machining step. As the brush, nylon or polypropylene of about φ0.2 to φ0.3 mm is preferably used. Further, a polishing liquid preferably contains cerium oxide with a particle diameter of about several μm. As the result of the brush polishing, in the surface roughness of the edge face of each of the inner circumference and the outer circumference, it is preferable that Rz is 0.2 μm to 0.4 μm and Ra is about 0.02 μm to 0.04 μm. With regard to the shape of the edge face of the glass substrate having been passed through the inner and outer diameter machining step and the inner and outer circumferential edge face machining step, the corner formed between the main surface and the edge face is eliminated and the state of droop from the main surface is created starting from a position of about 0.2 mm to 0.5 mm from the outer circumferential edge face.

Herein, Ra (arithmetic average roughness) and Rz (maximum height roughness) are defined by JIS B0601:2001. These can be measured using an atomic force microscope (AFM). These specifications and the measurement method are similarly applied to Ra and Rz to be described later.

In the above example, when a glass substrate is polished, diamond pellets and grinding liquid are used. However, may be employed a polishing method, in which a pad is bonded to each of the polishing surfaces of the upper and lower platens and polishing liquid is fed thereto. The polishing agent includes, for example, cerium oxide, zirconium oxide, aluminum oxide, manganese oxide, colloidal silica, and diamond. These are dispersed with water and used in the form of slurry. The pad is classified into a hard pad and a soft pad, which can be appropriately selected and used based on the intended purpose. As the hard pad, pads formed of material such as hard velour, urethane foam, or pitch-containing suede are listed. As the soft pad, pads formed of material such as suede or velour are listed.

The polishing method employing a pad and polishing agent is effective to polishing ranging from course polishing to precision polishing by changing the particle size of the polishing agent and the type of the pad. Therefore, the combination of polishing agent, the particle size of the polishing agent, and a pad can be appropriately selected so that in the first lapping step and the second lapping step, large undulations, chips, and cracks can be efficiently eliminated to achieve the above surface roughness.

Further, after the first and the second lapping step, a cleaning step is preferably carried out to eliminate a polishing agent and glass powder remaining on the surface of a glass substrate.

The polishers used in the first lapping step and the second lapping step have the same constitution. However, separate polishers exclusively prepared for each step are preferably used for polishing. It is because the polisher is bonded with dedicated diamond pellets, an extensive replacement operation is required to replace the pellets, and further a cumbersome operation, for example, to reset polishing conditions is required, resulting in decreased production efficiency.

(Chemical Strengthening Step)

Next to the second lapping step, a glass substrate is immersed in chemical strengthening liquid to form a chemically strengthened layer in the glass substrate. Formation of such a chemically strengthened layer makes it possible to enhance impact resistance, vibration resistance, and heat resistance.

The chemical strengthening step is carried out employing an ion exchange method, in which a glass substrate is immersed in heated chemical strengthening treatment liquid and thereby alkali metal ion such as lithium ion and sodium ion is replaced with an alkali metal ion such as potassium ion having ion diameter larger than the former. Due to distortion manufactured by the difference in ion diameter, in the area having been subjected to ion exchange, compression stress is generated, whereby the surface of the glass substrate is strengthened.

The chemical strengthening liquid is not specifically limited and any appropriate well-known chemical strengthening liquid is usable. Usually, a melted salt containing potassium ion or a melted salt containing potassium ion and sodium ion is commonly used. As the melted salt containing potassium ion and sodium ion, a nitrate, a carbonate, and a sulfate of potassium or sodium, as well as a mixed melted salt thereof. Of these, from the viewpoint of low melting point and the prevention ability of deformation of a glass substrate, a nitrate is preferably used.

A chemical strengthening liquid is heated so as to have higher temperature than the temperature at which the above component is fused. On the other hand, when the heating temperature of the chemical strengthening liquid is excessively high, the temperature of a glass substrate becomes excessively high, resulting in the possibility of deformation of the glass substrate. Therefore, the healing temperature of the chemical strengthening liquid is preferably lower than the glass transition point (Tg) of the glass substrate, and more preferably lower than the temperature of the glass transition point −50° C.

Herein, to prevent breakage and minute cracks of the glass substrate due to thermal shock caused when being immersed in the heated chemical strengthening liquid, prior to immersion in the chemical strengthening liquid, a preheating step may be provided in which the glass substrate is heated to a predetermined temperature in a preheating bath.

The thickness of the chemically strengthened layer is preferably in the range of about 5 μm to 15 μm in view of the balance of strength enhancement of the glass substrate and time reduction in the polishing step. When the thickness of the strengthened layer falls in this range, the glass substrate exhibiting excellent flatness and impact resistance which is mechanical strength can is realized.

The shape of the outer circumferential edge portion of the front main surface 7a after the chemical strengthening step is nearly unchanged compared with prior to the chemical strengthening step, and the entire surface of a glass substrate is almost uniformly covered by a chemical strengthened layer of about 5 μm to 15 μm as described above.

(First Polishing Step)

Next, a polishing step will now be described. In the polishing step, the surface of a glass substrate is precisely finished, and also polishing is carried out for the shape of the outer circumferential edge portion of the main surface.

Initially, to efficiently realize the surface roughness finally required in the second polishing step, in the first polishing step, polishing is carried out to improve surface roughness and to efficiently realize a desired shape.

In the polishing method, a polisher having the same constitution as the polisher used each in the first and the second lapping step is used except that instead of the diamond pellet and the grinding liquid used in the lapping step, a pad and a polishing liquid are used.

The pad is a hard pad with hardness A in the range of about 80 to 90. For example, foamed urethane is preferably used. When the hardness of the pad is decreased due to heat generation resulting from polishing, large shape variation of the polishing surface is generated. Therefore, a hard pad is preferably used. The polishing agent is preferably used in the form of slurry in which cerium oxide, colloidal silica, zirconium oxide, titanium oxide, or manganese oxide with a particle diameter of 0.6 μm to 2.5 μm is dispersed in water. The mixture ratio of water to the polishing agent is preferably about 1:9 to 3:7.

The machining pressure of the platens applied to a glass substrate is preferably 8826 Pa to 10787 Pa. The machining pressure of the platens applied to the glass substrate largely affects the shape of the outer circumferential edge portion. As the machining pressure increases, the inner side of the outer circumferential edge portion tends to be lowered and to rise toward the outer side. In contrast, as the machining pressure decreases, the outer circumferential edge portion becomes nearly flat and face droop tends to increase. With observation of such trends, the machining pressure can be determined.

Further, to maintain the flatness having been realized before the chemical strengthening step and in addition, to improve surface roughness, the rotation speed of the platens is allowed to be 25 rpm-50 rpm, and the rotation speed of the upper platen is preferably 30% to 40% smaller than that of the lower platen.

According to the above polishing conditions, polished amount is preferably 30 μm to 40 μm. In the case of less than 30 μm, scratches and defects cannot be sufficiently eliminated. In contrast, in the case of more than 40 μm, surface roughness can fall in the range of 2 nm to 60 nm in terms of Rz and 2 nm to 4 nm in terms of Ra, but unnecessary polishing is required, resulting in decreased production efficiency.

(Cleaning Step)

Using a well-known ultrasonic washing machine, a glass substrate is washed to remove polishing agent.

(Drying Step)

A glass substrate after washing is blown and dried with dry gas in which dust and contamination have been eliminated. The gas may be air or high-purity inert gas such as nitrogen gas. The temperature of the gas is preferably 15° C. to 200° C., more preferably 20° C. to 200° C. Gas blowing duration is at least 1 minute, preferably more than 3 minutes so as to the moisture having adhered to the glass substrate is completely dried.

(Heating Step)

A glass substrate is placed in a heating chamber and then heated at a temperature of 100° C. to 300° C. for 5 to 30 minutes.

(Second Polishing Step)

The second polishing step is a step to further precisely polish the surface of a glass substrate after the first polishing step. A pad used in the second polishing step is a soft pad which is softer than the pad used in the first polishing step and has a hardness of about 65-80 (Asker-C). For example, foamed urethane or suede is preferably used. As the polishing agent, cerium oxide, colloidal silica, zirconium oxide, titanium oxide, or manganese oxide as used in the first polishing step can be used. However, to further smoothen the surface of the glass substrate, a polishing agent having smaller particle diameter with small variation is preferably used. A polishing agent having an average particle diameter of 40 nm to 70 nm in terms of particle size is dispersed in water to form slurry to be used as a polishing liquid. The mixture ratio of water to the polishing agent is preferably about 1:9 to 3:7.

In the present invention, immediately after the heating step, that is, before a glass substrate having been exhibiting high temperature via the heating step is cooled, the second polishing step is carried out, whereby the second polishing step can be carried out in the state where the glass substrate surface has been activated due to the heating step, and the chemical reactivity has been substantially enhanced compared with immediately after the first polishing step.

Thereby, immediately after the second polishing step is performed, the polishing liquid is uniformly spread over the surface of the glass substrate, which has extremely enhanced reactivity, and then in a short period of time, uniform polishing characteristics are obtained over the entire surface of the glass substrate.

The machining pressure of the platens applied to a glass substrate is preferably 8826 Pa to 10787 Pa. The machining pressure of the platens applied to the glass substrate largely affects the shape of the outer circumferential edge portion in the same manner as in the first polishing step. However, since polishing speed is low, the shape cannot be changed efficiently compared with in the first polishing step. The shape of the outer circumferential edge portion changes in the same manner as in the first polishing step, due to the increase and decrease of the machining pressure. As the machining pressure increases, the inner side of the outer circumferential edge portion tends to be lowered and to rise toward the outer side. In contrast, as the machining pressure decreases, the outer circumferential edge portion becomes nearly flat and face droop tends to increase. To realize the shape of the outer circumferential edge portion, with observation of such a tendency, the machining pressure can be determined. The rotation speed of the platens is 15 rpm to 35 rpm, and the rotation speed of the upper platen is preferably smaller than that of the lower platen by 30% to 40%.

In the above manner, by adjusting polishing conditions in the second polishing step, a desired shape of the outer circumferential edge portion is realized, and the surface roughness can fall in the range of 2 nm to 6 nm in terms of Rz and 0.2 nm to 0.4 nm in terms of Ra.

The polished amount is preferably 2 μm-5 μm. When the polished amount is in this range, minute roughness and undulations having been generated in the surface and minute defects such as minute scars having been manufactured in the preceding steps can be efficiently eliminated.

Through the second polishing step, the chemically reinforced region in the glass substrate surface is decreased. There is no limitation whether the chemically reinforced region of the glass substrate surface remains or not and how much the thickness of the remaining chemically reinforced region is.

(Second Cleaning Step)
(Inspection Step)

The glass substrate will be completed after the glass substrate is cleaned and inspected after the second polishing step.

It should be noted that the method of producing a glass substrate for information recording medium may include various steps other than the above-described steps. For example, there may be included an anneal step for relaxing internal strain in the glass substrate, a heat shock step for confirming the strength of the glass substrate, and various inspection/evaluation steps.

In addition, in the second polishing step, instead of using the polisher used in the first polishing step as is, a different polisher which has the same structure and is prepared only for each step is preferably used. This is because if the polisher having been used in the first polishing step is used as is, the precision of polishing is decreased due to the remaining polishing agent used in the first polishing step and the like, or there is required a cumbersome work such as resetting the polishing condition, resulting in the decrease in productivity.

(Magnetic Film Forming Step)

A magnetic film 2 to be formed on the glass substrate will be described bellow. A magnetic recording medium D having the magnetic film 2 will be described in reference to FIG. 2.

In order to form the magnetic film 2, conventional known methods can be used, and listed are, for example, a method in which the substrate is spin-coated with thermosetting resin with magnetic particles dispersed therein, a sputtering method, or a non-electrolytic plating method. The thickness of the film is about 0.3 μm to 1.2 μm by a spin-coating method, about 0.04 μm to 0.08 μm by a sputtering method, about 0.05 μm to 0.1 μm by a non-electrolytic plating method. The sputtering method or the non-electrolytic plating method is preferably used from the viewpoint of forming thinner and higher-density films.

As material for the magnetic film, there is no specific limitation, and conventionally known material can be used. However, preferable is Co-based alloy in which Co is used as a basic material for high magnetic coercive force and Ni or Cr is added to adjust residual magnetic flux density. To be specific, listed are CoPt, CoCr, CoNi, CoNiCr, CoCrTa, CoPtCr, CoNiPt which contain Ci as a main material, and CoNiCrPt, CoNiCrTa, CoCrPtTa, CoCrPtB, CoCrPtSiO. The magnetic film may be constituted in a multi-layer structure (for example, CoPtCr/CrMo/CoPtCr, CoCrPtTa/CrMo/CoCrPtTa, etc.) divided by a non-magnetic film (for example, Cr, CrMo, CrV, etc.) to reduce noise. Other than the above-mentioned materials, there can be used ferrite-based material, iron-rare-earth-based material, or granular in which non-magnetic film made of $SiO_2$ or BN, etc. in which magnetic particles such as Fe, Co, FeCo, of CoNiPt are dispersed. In addition, the magnetic film may be an in-plane recording type or a vertical-recording type.

Further, to enhance the slippage of a magnetic head, the magnetic film surface may be thinly coated with lubricant. The lubricant includes those in which, for example, perfluoropolyether (PFPE) serving as liquid lubricant is diluted with a solvent such as a Freon-based one.

Still further, an underlayer and a protective layer may be provided as appropriate. Such an under layer in a magnetic disk is selected depending on the magnetic film. As material of the underlayer, at least one type of material selected from nonmagnetic metals such as, for example, Cr, Mo, Ta, Ti, W, V, B, Al, and Ni is cited. In the case of a magnetic film containing Co as a main component, from the viewpoint of magnetic characteristics enhancement, simple Cr or a Cr alloy is preferable. Further, the underlayer is not limited to a monolayer but may be a multilayered structure in which an identical layer or different types of layers are laminated. For example, a multilayered under layer such as Cr/Cr, Cr/CrMo, Cr/CrV, NiAl/Cr, NiAl/CrMo, or NiAl/CrV is employable.

The protective layer to prevent abrasion and erosion of a magnetic film includes, for example, a Cr layer, a Cr alloy layer, a carbon layer, a hydrogenated carbon layer, a zirconia layer, and a silica layer. Any of these protective layers can be continuously formed together with an underlayer and a magnetic film using an inline-type sputtering apparatus. Further, these protective layers may be formed into a monolayer or a multilayered structure containing the same layer or different types of layers. In addition, on the protective layer or instead of the protective layer, another layer may be formed. For example, instead of the protective layer, a silicon dioxide ($SiO_2$) layer may be formed in which on a Cr layer, colloidal silica fine particles dispersed in an alcohol-based solvent where tetraalkoxysilane is diluted is coated, followed by firing.

EXAMPLES

Glass substrates of Examples 1-4 were produced as follows.

(Producing Glass Substrate)

Based on the production process diagram described in FIG. 3, with regard to glass substrates of Examples 1-4, 100 sheets each were produced. In Examples 1-4, glass substrates were produced for varied heating temperature T1 (° C.).

As a glass material, aluminosilicate glass (Tg: 500° C.) was used, and then melted glass was press-molded to produce 300 sheets of blank materials. Via the inner and outer diameter machining step and the lapping step, each glass substrate was made to have an outer diameter of 65 mm and an inner diameter of 20 mm. The thickness of the glass substrate was made to be 0.64 mm.

(Chemical Strengthening Step)

A glass substrate was heated in a preheating chamber at a predetermined temperature. Then, the glass substrate was immersed in a chemical strengthening liquid having been heated at 300° C. For the chemical strengthening liquid, potassium nitrate was used.

(First Polishing Step)

A urethane pad (produced by Nitta Haas Inc.) was used, and as polishing agent, cerium oxide was used. Polishing conditions were as follows: pad hardness: 76 (hardness A), polishing agent particle diameter: 0.6 (μm), rotation speed: 30 (rpm), and machining pressure: 10787 (Pa).

(Cleaning Step)

Using an ultrasonic cleaning machine, 10-minute cleaning was carried out.

(Drying Step)

Clean air of ordinary temperature was blown to both sides of the glass substrate for 1 minute for drying.

(Heating Step)

The glass substrate was placed in a heating chamber and heated for 10 minutes. The heating temperature T1 was 90° C., 100° C., 300° C., and 310° C. for Example 1, Example 2, Example 3, and Example 4, respectively.

(Second Polishing Step)

A suede pad (produced by Filwel Co., Ltd.) was used, and as polishing agent, cerium oxide and colloidal silica were used. Polishing conditions were as follows: pad hardness: 80 (Asker-C), polishing agent particle diameter: 30 (nm), rotation speed: 30 (rpm), and machining pressure: 10787 (Pa).

Further, in Examples 1-4, the targeted polishing amount each was made to be 3 μm. In the present step, based on the polishing rate of Examples 1-4, the machining time realizing a polishing amount of 3 μm was determined and the polishing was performed. The machining time was 21.4 minutes and 16.7 minutes for Example 1 and Example 2, respectively and 15 minutes for Example 3 and Example 4, respectively. The polishing rates were determined based on the polishing amounts of experimental polishing for a predetermined period of time which were conducted in advance under the polishing conditions of Examples 1-4.

(Second Cleaning Step)

In the second cleaning step, brush cleaning was carried out using a roll-scrub machine and a cup-scrub machine, followed by cleaning using an ultrasonic cleaning machine.

Comparative Example

In Comparative Example, the first polishing step, the cleaning step, the drying step, and the second polishing step were carried out in this sequential order without heating step.

The targeted polishing amount is also 3 μm for Comparative Example. Based on the polishing rate previously determined experimentally under conditions of Comparative Example, machining time was made to be 25 minutes. Temperature conditions in each step are the same as in Example 1. In Comparative Example, 100 glass substrates were produced.

[Measurement Method]

Undulations and fine undulations of a glass substrate as well as a measurement method thereof will now be described.

Figure 4A:
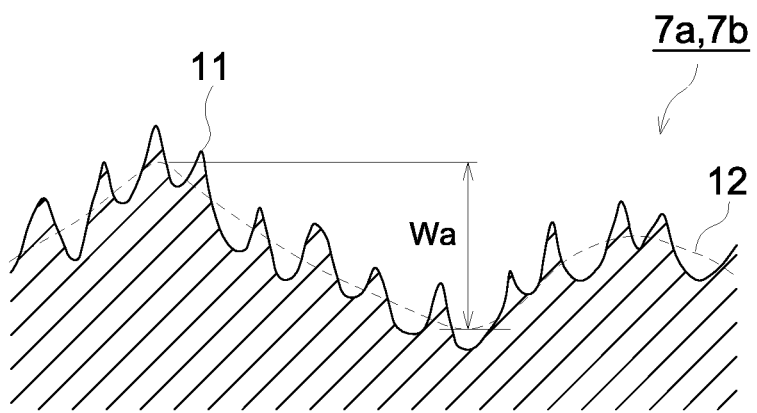
FIGS. 4a and 4b are enlarged sectional views of a substrate to illustrate undulations surface and minute undulations of the glass substrate.
Figure 4B:
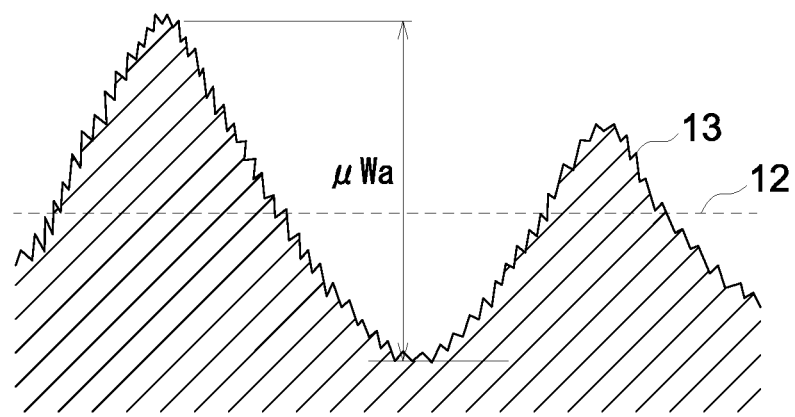

FIGS. 4a and 4b are enlarged sectional views of a glass substrate. Solid line 11 of FIG. 4a represents a determined sectional curve showing the surface shape of the glass substrate. Further, dotted line 12 represents an undulation curve showing undulations of the surface of the glass substrate. FIG. 4b is an enlarged view of part of FIG. 4a, representing fine undulations 13 occurring on undulation curve 12.

The height Wa of undulations of undulation curve 12 of FIG. 4a is measured over the entire glass substrate surface using a multifunctional disk interferometer (OPTIFLAT, produced by Phase Shift Technology, Inc.). The measurement principle is a method in which a minute shape change is determined based on the change in interference between reference light and measurement light which are different in phase, which change in interference is measured while the surface of a glass substrate is irradiated with white light. The thus-obtained measurement data was designated as Undulation Wa, after a component with 5 mm cycle or more was cut off therefrom.

The height of fine undulation μWa occurring on undulations of FIG. 4b is measured using a three-dimensional surface structure analysis microscope (produced by Zygo Corp., brand name: NEWVIEW5000). The wavelength was measured in the range of 30-200 μm, and the measurement was made in a 1 μm□ area at 4 locations, and then the average value thereof was designated as fine undulation μWa.

Herein, to measure a polishing amount, a thickness gauge was used.

[Determination Results]

Table 1 shows the average values of each measurement result of undulation Wa, fine undulation μWa, and a polishing rate which were measured with respect to the surface of each 100 glass substrates produced for each of Examples 1-4 and Comparative Example.

TABLE 1

| | Heating Temperature T1 (° C.) | Wa (nm) | μWa (nm) | Judgment | Polishing Rate (μm/min) |
|---|---|---|---|---|---|
| Example 1 | 90 | 0.35 | 0.16 | B | 0.14 |
| Example 2 | 100 | 0.33 | 0.14 | A | 0.18 |
| Example 3 | 300 | 0.32 | 0.14 | A | 0.20 |
| Example 4 | 310 | 0.34 | 0.16 | B | 0.20 |
| Comparative Example | — | 0.36 | 0.16 | C | 0.12 |

In the judgment of the measurement results, the case where the average value of undulation Wa is less or equal to 0.335 nm and the average value of fine undulation μWa is less of equal to 0.145 nm is ranked as A; the case where the average value of undulation Wa is less or equal to 0.35 nm and the average value of fine undulation μWa is less or equal to 0.16 nm is ranked as B; and other cases are ranked as C.

As shown in Table 1, in Example 2, the average value of undulation Wa and the average value of fine undulation μWa were 0.33 nm and 0.14 nm, respectively, and in Example 3, the average value of undulation Wa and the average value of fine undulation μWa were 0.32 nm and 0.14 nm, respectively, whereby judgment was A. Further, in Example 1, the average value of undulation Wa and the average value of fine undulation μWa were 0.35 nm and 0.16 nm, respectively, and in Example 4, the average value of undulation Wa and the average value of fine undulation μWa were 0.34 nm and 0.16 nm, respectively, whereby judgment was B.

It is understood that the heating temperature of Example 1 was lower than that of Example 2 and a hydrated layer was insufficiently eliminated, whereby chemical reaction with a polishing material was insufficiently accelerated, resulting in judgment B.

It is understood that the heating temperature of Example 4 was higher than that of Example 3, and the glass of the disk surface was thermally changed in microscopic portions, whereby uniform polishing was not carried out, resulting in judgment B.

On the other hand, in Comparative Example, the average value of Wa and the average value of fine undulation μWa were 0.36 nm and 0.16 nm, respectively, hence judgment was C.

Further, the polishing rate of Example 1, the polishing rate of Example 2, the polishing rate of Example 3, and the polishing rate of Example 4 were 0.14 μm/min, 0.18 μm/min, 0.20 μm/min, and 0.20 μm/min, respectively. In contrast, the polishing rate of Comparative Example was 0.12 μm/min. Thus, it is understood that in Examples, the machining time of the second polishing step was substantially reduced.

As described above, according to the present invention, provided is a method for producing a glass substrate in which a glass substrate having enhanced flatness can be efficiently produced and a method for producing a magnetic recording medium in which a magnetic recording medium having enhanced flatness can be efficiently produced.

DESCRIPTION OF THE NUMERALS

1: glass substrate
2: magnetic film
5: hole
7a: front main surface
7b: rear main surface
10t: outer circumferential edge face
11: measured sectional curve
12: undulation curve
13: fine undulation curve
20t: inner circumferential edge face
D: magnetic disk

The invention claimed is:

1. A method for producing a glass substrate comprising successively:
  polishing a surface of the glass substrate with a first polishing liquid containing a first polishing agent;
  heating the glass substrate in a heating chamber at or between 100° C. to 300° C. to heat all of the glass substrate so as to dry the glass substrate; and
  subsequent to the heating, polishing the surface of the glass substrate with a second polishing liquid containing a second polishing agent.

2. The method of claim 1, wherein the polishing of the surface of the glass substrate with the second polishing liquid is performed just after the heating of the glass substrate.

3. The method of claim 1 further comprising, between the polishing of the surface of the glass substrate with the first polishing liquid and the heating of the glass substrate: cleaning the glass substrate; and drying the glass substrate.

4. The method of claim 3, wherein the drying of the glass substrate comprises blowing, gas is against the glass substrate.

5. The method of claim 3, wherein the polishing of the surface of the glass substrate with the second polishing liquid is performed before the glass substrate, heated via the heating the glass substrate, cools.

6. The method of claim 1 wherein the first and second polishing agents are the same.

7. The method of claim 6 wherein the second polishing agent has smaller diameter particles than the first polishing agent.

8. The method of claim 1, wherein the polishing of the surface of the glass substrate with the second polishing liquid is performed before the glass substrate, heated via the heating the glass substrate, cools.

9. The method of claim 1, wherein the heating of the glass substrate comprises heating the glass substrate for 5 to 30 minutes.

10. A method for producing a magnetic recording medium, the method comprising:
  producing a glass substrate by performing the following processes successively:
    polishing a surface of the glass substrate with a first polishing liquid containing a first polishing agent;
    heating the glass substrate in a heating chamber at or between 100° C. to 300° C. to heat all of the glass substrate so as to dry the glass substrate; and
    subsequent to the heating, polishing the surface of the glass substrate with a second polishing liquid containing a second polishing agent; and
  forming a magnetic film on the glass substrate.

11. The method of claim 10, wherein the heating of the glass substrate comprises heating the glass substrate for 5 to 30 minutes.

* * * * *